US009786243B2

(12) United States Patent
Cho et al.

(10) Patent No.: US 9,786,243 B2
(45) Date of Patent: Oct. 10, 2017

(54) GATE DRIVING CIRCUIT AND DISPLAY APPARATUS INCLUDING THE SAME

(71) Applicant: Samsung Display Co., Ltd., Yongin-si, Gyeonggi-Do (KR)

(72) Inventors: Sehyoung Cho, Hwaseong-si (KR); Kyung-hoon Kim, Uiwang-si (KR); Dongwoo Kim, Suwon-si (KR); Ilgon Kim, Seoul (KR); Kangmoon Jo, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 51 days.

(21) Appl. No.: 14/936,434

(22) Filed: Nov. 9, 2015

(65) Prior Publication Data

US 2016/0210927 A1 Jul. 21, 2016

(30) Foreign Application Priority Data

Jan. 16, 2015 (KR) ........................ 10-2015-0008244

(51) Int. Cl.
*H03K 17/687* (2006.01)
*G09G 3/36* (2006.01)

(52) U.S. Cl.
CPC ......... *G09G 3/3677* (2013.01); *G09G 3/3696* (2013.01); *G09G 3/3614* (2013.01); *G09G 2310/0251* (2013.01); *G09G 2310/08* (2013.01)

(58) Field of Classification Search
CPC . G09G 3/3696; G09G 3/3677; G02F 1/13624
USPC .................................... 345/101, 211; 349/48
See application file for complete search history.

(56) References Cited

U.S. PATENT DOCUMENTS

2008/0100560 A1* 5/2008 Na ........................ G09G 3/3677 345/101
2009/0027581 A1* 1/2009 You ..................... G02F 1/13624 349/48
2010/0315403 A1 12/2010 Kaneyoshi et al.
2014/0055436 A1* 2/2014 Han ..................... G09G 3/3696 345/211

(Continued)

FOREIGN PATENT DOCUMENTS

KR 10-2009-0012650 A 2/2009
KR 10-2009-0073261 A 7/2009
KR 10-2014-0042308 A 4/2014

*Primary Examiner* — Nicholas Lee
*Assistant Examiner* — Abdul-Samad A Adediran
(74) *Attorney, Agent, or Firm* — Innovation Counsel LLP

(57) ABSTRACT

A gate driving circuit includes a plurality of stages for providing gate signals, wherein a k-th stage (k is a natural number greater than 3) includes a first output transistor including a control electrode connected to a first node, an input electrode for receiving a clock signal, and an output electrode for outputting a k-th gate signal, a second output transistor including a control electrode connected to the first node, an input electrode for receiving the clock signal, and an output electrode for outputting a k-th carry signal, a pull-down unit connected to a discharge node to pull down the output electrode of the first output transistor in response to a signal of the discharge node, and a discharge unit configured to output a (k−1)-th carry signal output from a (k−1)-th stage to the discharge node in response to a (k+1)-th carry signal output from a (k+1)-th stage.

16 Claims, 10 Drawing Sheets

(56) References Cited

U.S. PATENT DOCUMENTS

2014/0118331 A1 5/2014 Jeon et al.

* cited by examiner

FIG. 5
t1
t2
t3
t4
t5
Vck
Vd
Gk
CRk-1
CRk
CRk+1
CRk+2
CRk+3

GATE DRIVING CIRCUIT AND DISPLAY APPARATUS INCLUDING THE SAME

This U.S. non-provisional patent application claims priority to Korean Patent Application No. 10-2015-0008244, and all the benefits accruing therefrom under 35 U.S.C. §119, filed on Jan. 16, 2015, the entire contents of which are hereby incorporated by reference.

BACKGROUND

The present disclosure herein relates to a driving circuit and a display device including the same.

A liquid crystal display device, which is a type of various display devices, generally includes two substrates opposing each other and a liquid crystal layer disposed therebetween. When voltage is applied to two electrodes provided at inner sides of the substrates, an electric field is generated in the liquid crystal layer due to a potential difference between the electrodes, and an arrangement of liquid crystal molecules is changed according to the intensity of the electric field. However, if a unidirectional electric field is continuously applied to the liquid crystal layer, electrical and physical characteristics of the liquid crystal layer may be degraded. Therefore, it is advantageous to periodically change the direction of the electric field. According to a typical method of changing the direction of an electric field, a polarity of a voltage of one electrode is inverted with respect to a voltage of another electrode.

Such an inversion driving scheme may be classified into frame inversion for inverting a polarity on a frame-by-frame basis, line inversion for inverting a polarity on a line-by-line basis, and dot inversion for inverting a polarity on a pixel-by-pixel basis.

Due to a signal delay in a gate line, a pixel may not be charged with a desired data voltage. A precharge driving scheme is used to compensate for a reduced charging amount of a data voltage applied to a pixel. According to this scheme, an application time of a gate signal is adjusted to be longer than one horizontal period.

A desired charging rate may not be assured if a polarity of a data signal at the time of precharge driving is different from that of the data signal at the time of main charge driving.

SUMMARY

The present disclosure provides a display device including a driving circuit employing a precharge driving technology for improving a charging rate.

Embodiments of the present disclosure provide gate driving circuits including stages for providing gate signals to gate lines of a display panel, a k-th stage (where k is a natural number greater than 3) of the stages including a first output transistor including a control electrode connected to a first node, an input electrode configured to receive a clock signal, and an output electrode configured to output a k-th gate signal, a second output transistor including a control electrode connected to the first node, an input electrode configured to receive the clock signal, and an output electrode configured to outputting a k-th carry signal, a pull-down unit connected to a discharge node and configured to pull down the output electrode of the first output transistor in response to a signal of the discharge node, and a discharge unit configured to output a (k−1)-th carry signal output from a (k−1)-th stage to the discharge node in response to a (k+1)-th carry signal output from a (k+1)-th stage.

In exemplary embodiments, the discharge unit may be further configured to output a (k+2)-th carry signal output from a (k+2)-th stage to the discharge node in response to a (k+3)-th carry signal output from a (k+3)-th stage.

In other exemplary embodiments, the discharge unit may include a first discharge transistor connected between the discharge node and the (k−1)-th carry signal, the first discharge transistor including a control electrode connected to the (k+1)-th carry signal, and a second discharge transistor connected between the discharge node and the (k+2)-th carry signal, the second discharge transistor including a control electrode connected to the (k+3)-th carry signal.

In other exemplary embodiments, the gate driving circuit may further include a control unit configured to control potentials of the first node and a second node in response to a (k−3)-th carry signal output from a (k−3)-th stage, a (k+6)-th carry signal output from a (k+6)-th stage, and the (k+3)-th carry signal output from the (k+3)-th stage.

In other exemplary embodiments, the pull-down unit may include a first pull-down transistor connected between the output electrode of the first output transistor and a first ground voltage, the first pull-down transistor including a control electrode connected to the discharge node, and a second pull-down transistor connected between the output electrode of the first output transistor and the first ground voltage, the second pull-down transistor including a control electrode connected to the second node.

In other exemplary embodiments, the gate driving circuit may further include a first capacitor connected between the output electrode of the first output transistor and the control electrode of the first output transistor, and a second capacitor connected between the output electrode of the second output transistor and the control electrode of the second output transistor.

In exemplary embodiments, a capacitance of the second capacitor may be greater than that of the first capacitor.

In other exemplary embodiments of the disclosure, gate driving circuits include stages for providing gate signals to gate lines of a display panel, a k-th stage (where k is a natural number greater than 4) of the stages including a first output transistor including a control electrode connected to a first node, an input electrode configured to receive a clock signal, and an output electrode configured to output a k-th gate signal, a second output transistor including a control electrode connected to the first node, an input electrode configured to receive the clock signal, and an output electrode configured to output a k-th carry signal, a pull-down unit connected to a discharge node and configured to pull down the output electrode of the first output transistor in response to a signal of the discharge node, and a discharge unit configured to output a (k−1)-th carry signal output from a (k−1)-th stage to the discharge node in response to a (k+2)-th carry signal output from a (k+2)-th stage.

In exemplary embodiments, the discharge unit may be further configured to output a (k+3)-th carry signal output from a (k+3)-th stage to the discharge node in response to a (k+4)-th carry signal output from a (k+4)-th stage.

In other exemplary embodiments, the discharge unit may include a first discharge transistor connected between the discharge node and the (k−1)-th carry signal, the first discharge transistor including a control electrode connected to the (k+2)-th carry signal, and a second discharge transistor connected between the discharge node and the (k+3)-th carry signal, the second discharge transistor including a control electrode connected to the (k+4)-th carry signal.

In other exemplary embodiments, the gate driving circuit may further include a control unit configured to control potentials of the first node and a second node in response to a (k−4)-th carry signal output from a (k−4)-th stage, a (k+8)-th carry signal output from a (k+8)-th stage, and the (k+4)-th carry signal output from the (k+4)-th stage.

In other exemplary embodiments, the pull-down unit may include a first pull-down transistor connected between the output electrode of the first output transistor and a first ground voltage, the first pull-down transistor including a control electrode connected to the discharge node, and a second pull-down transistor connected between the output electrode of the first output transistor and the first ground voltage, the second pull-down transistor including a control electrode connected to the second node.

In other exemplary embodiments of the present disclosure, display devices include a display panel including a plurality of pixels respectively connected to a plurality of gate lines and a plurality of data lines, a data driving circuit configured to periodically invert a polarity of a data signal to drive the data lines, a gate driving circuit configured to output a plurality of gate signals for driving the gate lines in response to a clock signal, and a driving control unit configured to provide the data signal to the data driving circuit and provide the clock signal to the gate driving circuit.

In exemplary embodiments, the gate driving circuit may include a plurality of stages, and a k-th stage (where k is a natural number greater than 3) of the stages may include a first output transistor including a control electrode connected to a first node, an input electrode configured to receive the clock signal, and an output electrode configured to output a k-th gate signal, a second output transistor including a control electrode connected to the first node, an input electrode configured to receiving the clock signal, and an output electrode configured to outputting a k-th carry signal, a pull-down unit connected to a discharge node and configured to pull down the output electrode of the first output transistor in response to a signal of the discharge node, and a discharge unit configured to output a (k−1)-th carry signal output from a (k−1)-th stage to the discharge node in response to a (k+1)-th carry signal output from a (k+1)-th stage.

In other exemplary embodiments, the discharge unit may be further configured to output a (k+2)-th carry signal output from a (k+2)-th stage to the discharge node in response to a (k+3)-th carry signal output from a (k+3)-th stage.

In other exemplary embodiments, the discharge unit may include a first discharge transistor connected between the discharge node and the (k−1)-th carry signal, the first discharge transistor including a control electrode connected to the (k+1)-th carry signal, and a second discharge transistor connected between the discharge node and the (k+2)-th carry signal, the second discharge transistor including a control electrode connected to the (k+3)-th carry signal.

In other exemplary embodiments, the display device may further include a control unit configured to control potentials of the first node and a second node in response to a (k−3)-th carry signal output from a (k−3)-th stage, a (k+6)-th carry signal output from a (k+6)-th stage, and the (k+3)-th carry signal output from the (k+3)-th stage.

In other exemplary embodiments, the pull-down unit may include a first pull-down transistor connected between the output electrode of the first output transistor and a first ground voltage, the first pull-down transistor including a control electrode connected to the discharge node, and a second pull-down transistor connected between the output electrode of the first output transistor and the first ground voltage, the second pull-down transistor including a control electrode connected to the second node.

In exemplary embodiments, the display device may further include a first capacitor connected between the output electrode of the first output transistor and the control electrode of the first output transistor, and a second capacitor connected between the output electrode of the second output transistor and the control electrode of the second output transistor.

In exemplary embodiments, a capacitance of the second capacitor may be greater than that of the first capacitor.

BRIEF DESCRIPTION OF THE DRAWINGS

The accompanying drawings are included to provide a further understanding of the present disclosure, and are incorporated in and constitute a part of this specification. In particular, the drawings illustrate exemplary embodiments of the present system and method and, together with the description, serve to explain principles of the inventive concept. In the drawings.

DETAILED DESCRIPTION OF THE EMBODIMENTS

Exemplary embodiments of the present disclosure are described in detail with reference to the accompanying drawings.

Figure 1:
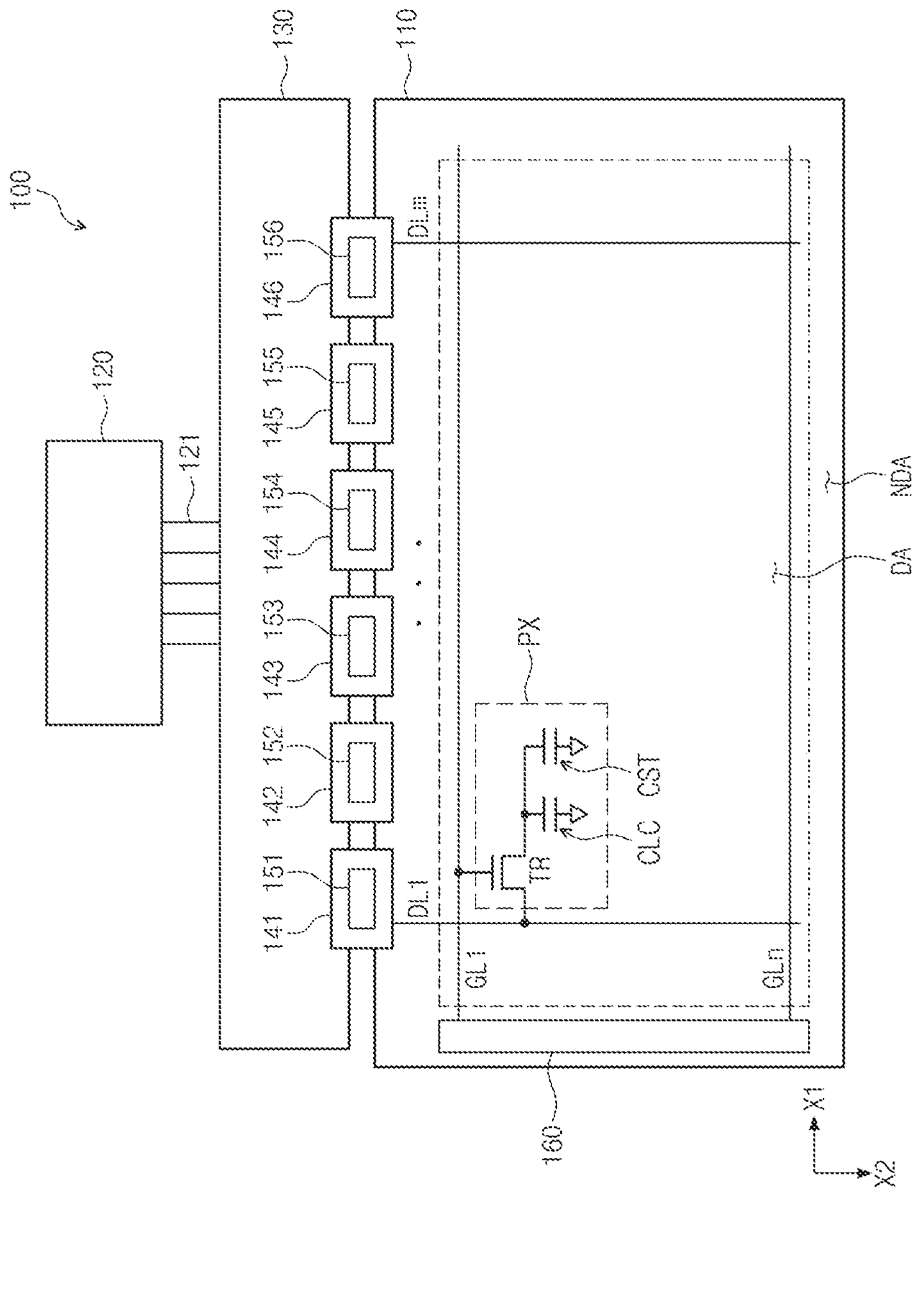
FIG. 1 is a planar view illustrating a display device according to an embodiment of the present disclosure.

FIG. 1 is a planar view illustrating a display device according to an embodiment of the present disclosure.

Referring to FIG. 1, a display device 100 includes a display panel 110, a driving control unit 120, a printed circuit board 130, a plurality of data driving circuits 141 to 146, and a gate driving circuit 160.

The display panel 110 includes a display area DA provided with a plurality of pixels PX and a non-display area NDA adjacent to the display area DA. The display area DA is configured to display an image, while the non-display area NDA is not configured to display an image. A glass substrate, a silicon substrate, a film substrate or the like may be adopted for the display panel 110.

Each of the plurality of pixels has the same structure. Therefore, only one pixel PX is described in detail, instead of providing description for each pixel PX. The pixel PX includes a thin-film transistor TR, a liquid crystal capacitor CLC, and a storage capacitor CST.

The thin-film transistor TR of the pixel PX includes a gate electrode connected to a first gate line GL1 among a plurality of gate lines GL1 to GLn, a source electrode connected to a first data line DL1 among a plurality of data lines DL1 to DLm, and a drain electrode connected to the liquid crystal capacitor CLC and the storage capacitor CST. One terminal of each of the liquid crystal capacitor CLC and the storage capacitor CST is connected in parallel to the drain electrode of the thin-film transistor TR. The other terminal of each of the liquid crystal capacitor CLC and the storage capacitor CST may be connected to a common voltage.

The printed circuit board 130 may include various circuits for driving the display panel 110. The printed circuit board 130 may include a plurality of wirings to be connected to the driving control unit 120, the data driving circuits 141 to 146, and the gate driving circuit 160.

The driving control unit 120 may be electrically connected to the printed circuit board 130 through a cable 121. In another embodiment, the driving control unit 120 may be directly mounted on the printed circuit board 130.

The driving control unit 120 is configured to provide a data signal DATA and a first control signal CONT1 to the data driving circuits 141 to 146 through the cable 121, and to provide a second control signal CONT2 to the gate driving circuit 160. The first control signal CONT1 may include a horizontal synchronization start signal, a clock signal, a line latch signal, a polarity control signal, and a test mode signal, and the second control signal CONT2 may include a vertical synchronization start signal, an output enable signal, and a gate pulse signal.

Each of the data driving circuits 141 to 146 may be implemented as a tape carrier package (TCP) or a chip on film (COF), and data driving circuit integrated circuits 151 to 156 are respectively mounted thereon. The data driving circuit integrated circuits 151 to 156 drive the plurality of data lines in response to the first control signal CONT1 and the data signal DATA from the driving control unit 120. The data driving circuit integrated circuits 151 to 156 may be directly mounted on the non-display area NDA of the display panel 110 using a chip on glass (COG) technology, instead of being disposed on the printed circuit board 130. Each of the data driving circuit integrated circuit 151 to 156 drives corresponding data lines among the data lines DL1 to DLm.

The data driving circuits 141 to 146 are sequentially arranged in a first direction X1 at a first side of the display panel 110. The gate driving circuit 160 is disposed at a second side of the display panel 110.

The gate driving circuit 160 is implemented using an amorphous silicon gate (ASG) with an amorphous silicon thin film transistor (a-Si TFT), an oxide semiconductor, a crystalline semiconductor, a polycrystalline semiconductor or the like, and is integrated with the non-display area (NDA) of the display panel 110. In another embodiment, the gate driving circuit 160 may be implemented with a TCP or a COF.

The gate driving circuit 160 drives the gate lines GL1 to GLn in response to the second control signal CONT2 from the driving control unit 120. The second control signal CONT2 may include at least one clock signal. When a gate-on voltage VON is applied to one gate line, thin film transistors of one row connected thereto are turned on. As a result, data driving signals corresponding to the data signal DATA and provided to the data lines DL1 to DLm by the data driving circuit integrated circuits 151 to 156 are applied to corresponding pixels through the thin film transistors turned on.

Figure 2:
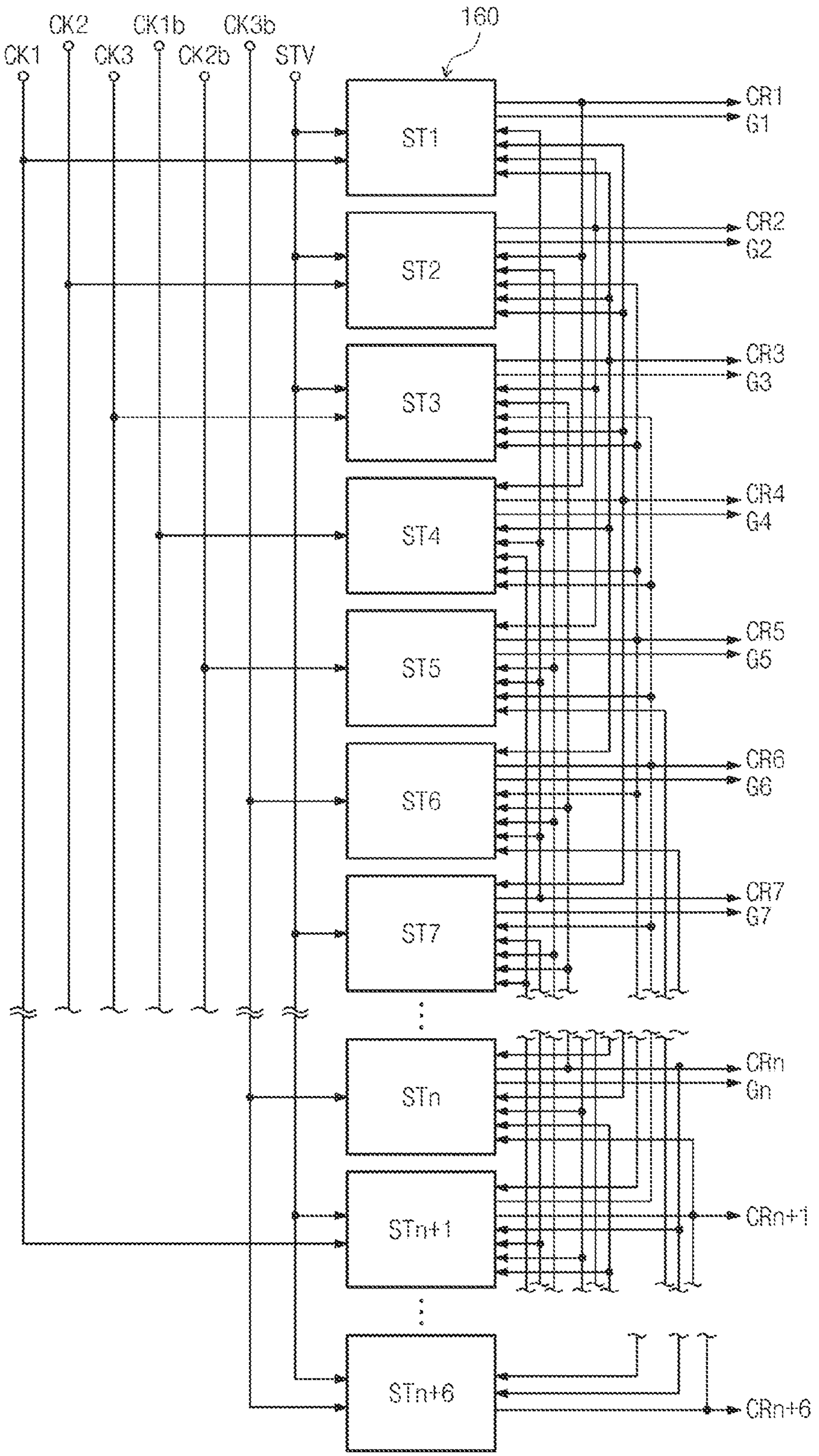
FIG. 2 is a block diagram illustrating an exemplary configuration of the gate driving circuit illustrated in FIG. 1.

FIG. 2 is a block diagram illustrating an exemplary configuration of the gate driving circuit of FIG. 1.

Referring to FIG. 2, the gate driving circuit 160 includes a plurality of stages ST1 to STn and dummy stages STn+1 to STn+6. The stages ST1 to STn respectively correspond to the gate lines GL1 to GLn, and output carry signals CR1 to CRn and gate signals G1 to Gn. The dummy stages STn+1 to STn+6 output carry signals CRn+1 to CRn+6.

The gate driving circuit 160 receives six clock signals CK1 to CK3 and CK1*b* to CK3*b* from the driving control unit 120 illustrated in FIG. 1. The stages ST1, ST7, ST13 and so on are operated in response to the clock signal CK1. The stages ST2, ST8, ST14 and so on are operated in response to the clock signal CK2. The stages ST3, ST9, ST15 and so on are operated in response to the clock signal CK3. The stages ST4, ST10, ST16 and so on are operated in response to the clock signal CK1*b*. The stages ST5, ST11, ST17 and so on are operated in response to the clock signal CK2*b*. The stages ST6, ST12, ST18 and so on are operated in response to the clock signal CK3*b*. The dummy stages STn+1 to STn+6 are operated in response to the clock signals CK1 to CK3 and CK1*b* to CK3*b*, respectively.

The stages STk (where $1 \le k \le 3$) receive a vertical synchronization start signal STV, a next carry signal CRk+1, a next carry signal CRk+2, a next carry signal CRk+3, and a next carry signal CRk+6, and outputs a carry signal CRk and a gate signal Gk.

The stages STk (where $3 < k \le n$) receive a previous carry signal CRk−3, a previous carry signal CRk−1, a next carry signal CRk+1, a next carry signal CRk+2, a next carry signal CRk+3, and a next carry signal CRk+6, and outputs a carry signal CRk and a gate signal Gk.

The dummy stage STn+1 receives a previous carry signal CRn−2, a previous carry signal CRn, a next carry signal CRn+2, a next carry signal CRn+3, a next carry signal CRn+4, and the vertical synchronization start signal STV, and outputs a carry signal CRn+1. The dummy stage STn+2 receives a previous carry signal CRn−1, a previous carry signal CRn+1, a next carry signal CRn+3, a next carry signal CRn+4, a next carry signal CRn+5, and the vertical synchronization start signal STV, and outputs a carry signal CRn+2. The dummy stage STn+3 receives a previous carry signal CRn, a previous carry signal CRn+2, a next carry signal CRn+4, a next carry signal CRn+5, a next carry signal CRn+6, and the vertical synchronization start signal STV, and outputs a carry signal CRn+3. The dummy stage STn+4 receives a previous carry signal CRn+1, a previous carry signal CRn+3, a next carry signal CRn+5, a next carry signal CRn+6, and the vertical synchronization start signal STV, and outputs a carry signal CRn+4. The dummy stage STn+5 receives a previous carry signal CRn+2, a previous carry signal CRn+4, a next carry signal CRn+6, and the vertical synchronization start signal STV, and outputs a carry signal CRn+5. The dummy stage STn+6 receives a previous carry signal CRn+2, a previous carry signal CRn+4, and the vertical synchronization start signal STV, and outputs a carry signal CRn+6.

Although not illustrated in FIG. 2, each of the stages ST1 to STn and the dummy stages STn+1 to STn+6 is connected to a first ground voltage VSS1 and a second ground voltage VSS2. In the present embodiment, the first ground voltage VSS1 and the second ground voltage VSS2 have different voltage levels. In another embodiment, the first ground voltage VSS1 and the second ground voltage VSS2 may have the same voltage level.

Figure 3:
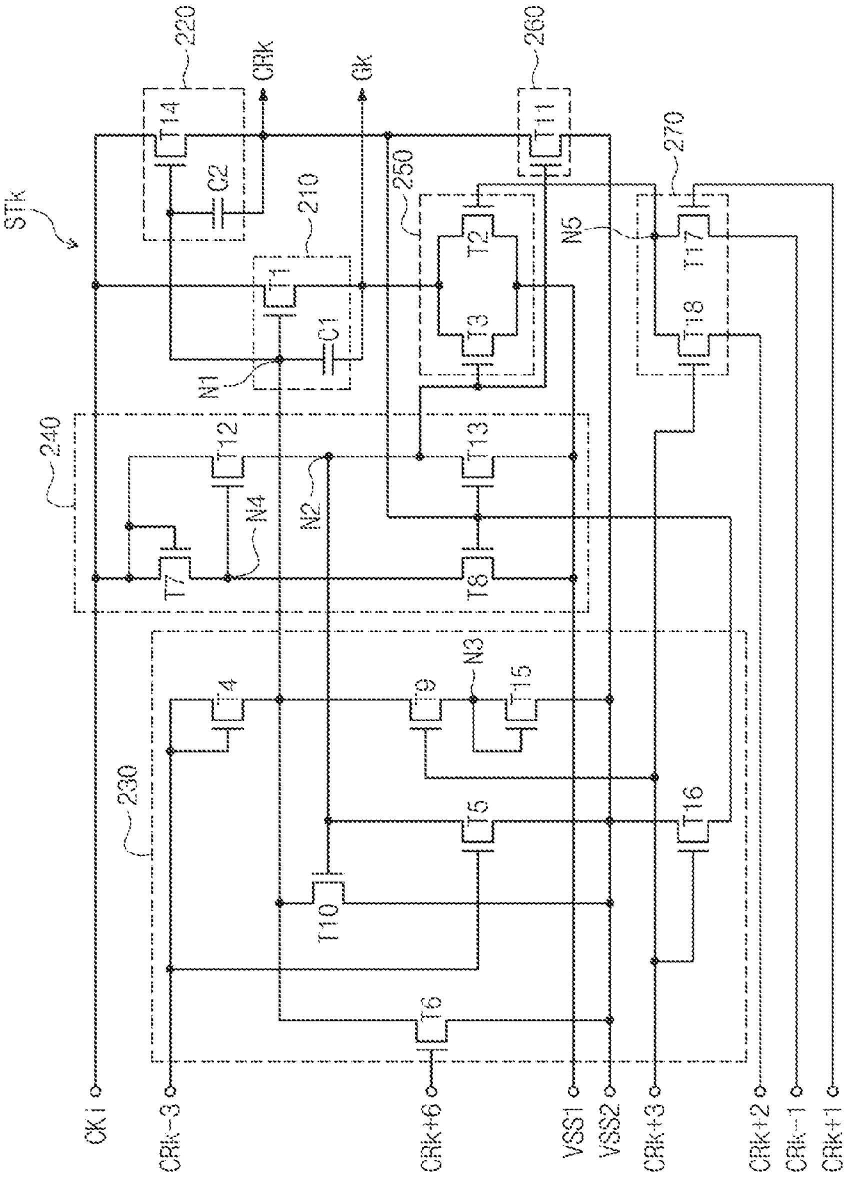
FIG. 3 is diagram exemplarily illustrating one of the stages illustrated in FIG. 2.

FIG. 3 is diagram exemplarily illustrating one of the stages illustrated in FIG. 2.

Referring to FIG. 3, the stage STk (where 3<k≤n) includes a first output unit 210, a second output unit 220, a control unit 230, an inverter unit 240, a first pull-down unit 250, a second pull-down unit 260, and a discharge unit 270.

The first output unit 210 includes a capacitor C1 and a first output transistor T1. The first output transistor T1 includes a control electrode connected to a first node N1, an input electrode for receiving the clock signal CKi (where i is one of 1, 2, 3, 1b, 2b, and 3b), and an output electrode for outputting the gate signal Gk. The capacitor C1 is connected between the first node N1 and the output electrode of the first output transistor T1.

The second output unit 220 includes a capacitor C2 and a second output transistor T14. The second output transistor T14 includes a control electrode connected to the first node N1, an input electrode for receiving the clock signal CKi (where i is one of 1, 2, 3, 1b, 2b, and 3b), and an output electrode for outputting the carry signal CRk. According to one embodiment, the capacitance of C2 may be greater than that of C1.

The control unit 230 includes transistors T4 to T6, T9, T10, T15, and T16. The transistor T4 is connected between the previous carry signal CRk−3 and the first node N1, and includes a control electrode connected to the previous carry signal CRk−3. The transistor T5 is connected between a second node N2 and the second ground voltage VSS2, and includes a control electrode connected to the previous carry signal CRk−3. The transistor T6 is connected between the first node N1 and the second ground voltage VSS2, and includes a control electrode connected to the next carry signal CRk+6.

The transistor T9 is connected between the first node N1 and a third node N3, and includes a control electrode connected to the next carry signal CRk+3. The transistor T15 is connected between the third node N3 and the second ground voltage VSS2, and includes a control electrode connected to the third node N3.

The transistor T10 is connected between the first node N1 and the second ground voltage VSS2, and includes a control electrode connected to the second node N2.

The transistor T16 is connected between the second ground voltage VSS2 and the output electrode of the second transistor T14 for outputting the carry signal CRk, and includes a control electrode connected to the next carry signal CRk+3.

The inverter unit 240 includes transistors T7, T8, T12 and T13. The transistor T7 is connected between the clock signal CKi and a fourth node N4, and includes a control electrode connected to the clock signal CKi. The transistor T8 is connected between the fourth node N4 and the first ground voltage VSS1, and includes a control electrode connected to the output electrode of the second transistor T14 for outputting the carry signal CRk.

The transistor T12 is connected between the clock signal CKi and the second node N2, and includes a control electrode connected to the fourth node N4. The transistor T13 is connected between the second node N2 and the first ground voltage VSS1, and includes a control electrode connected to the output electrode of the second transistor T14 for outputting the carry signal CRk.

The first pull-down unit 250 includes transistors T2 and T3. The transistor T2 is connected between the first ground voltage VSS1 and the output electrode of the first transistor T1 for outputting the gate signal Gk, and includes a control electrode connected to a discharge node N5. The transistor T3 is connected between the first ground voltage VSS1 and the output electrode of the first transistor T1 for outputting the gate signal Gk, and includes a control electrode connected to the second node N2.

The second pull-down unit 260 includes a transistor T11. The transistor T11 is connected between the second ground voltage VSS2 and the output electrode of the second transistor T14 for outputting the carry signal CRk, and includes a control electrode connected to the second node N2.

The discharge unit 270 includes a first discharge transistor T17 and a second discharge transistor T18. The first discharge transistor T17 is connected between the discharge node N5 and the previous carry signal CRk−1 output from the previous stage STk−1, and includes a control electrode connected to the next carry signal CRk+1 output from the next stage STk+1. The second discharge transistor T18 is connected between the discharge node N5 and the next carry signal CRk+2 output from the next stage STk+2, and includes a control electrode connected to the next carry signal CRk+3 output from the next stage STk+3.

Although FIG. 3 illustrates the stage STk (where 3<k≤n) alone, the other stages ST1 to ST3 illustrated in FIG. 2 have the same configuration as that of the stage illustrated in FIG. 3 except the stages ST1 to ST3 receive the vertical synchronization start signal STV instead of the previous carry signal CRk−3. Furthermore, the stage ST1 receives the vertical synchronization start signal STV instead of the previous carry signal CRk−1.

The dummy stages STn+1 to STn+3 illustrated in FIG. 2 receive the vertical synchronization start signal STV instead of the next carry signal CRk+6. The dummy stages STn+4 to STn+6 receive the vertical synchronization start signal STV instead of the next carry signal CRk+3. The dummy stages STn+4 to STn+6 do not include the transistor T6 and do not receive the next carry signal CRk+6.

Figure 4:
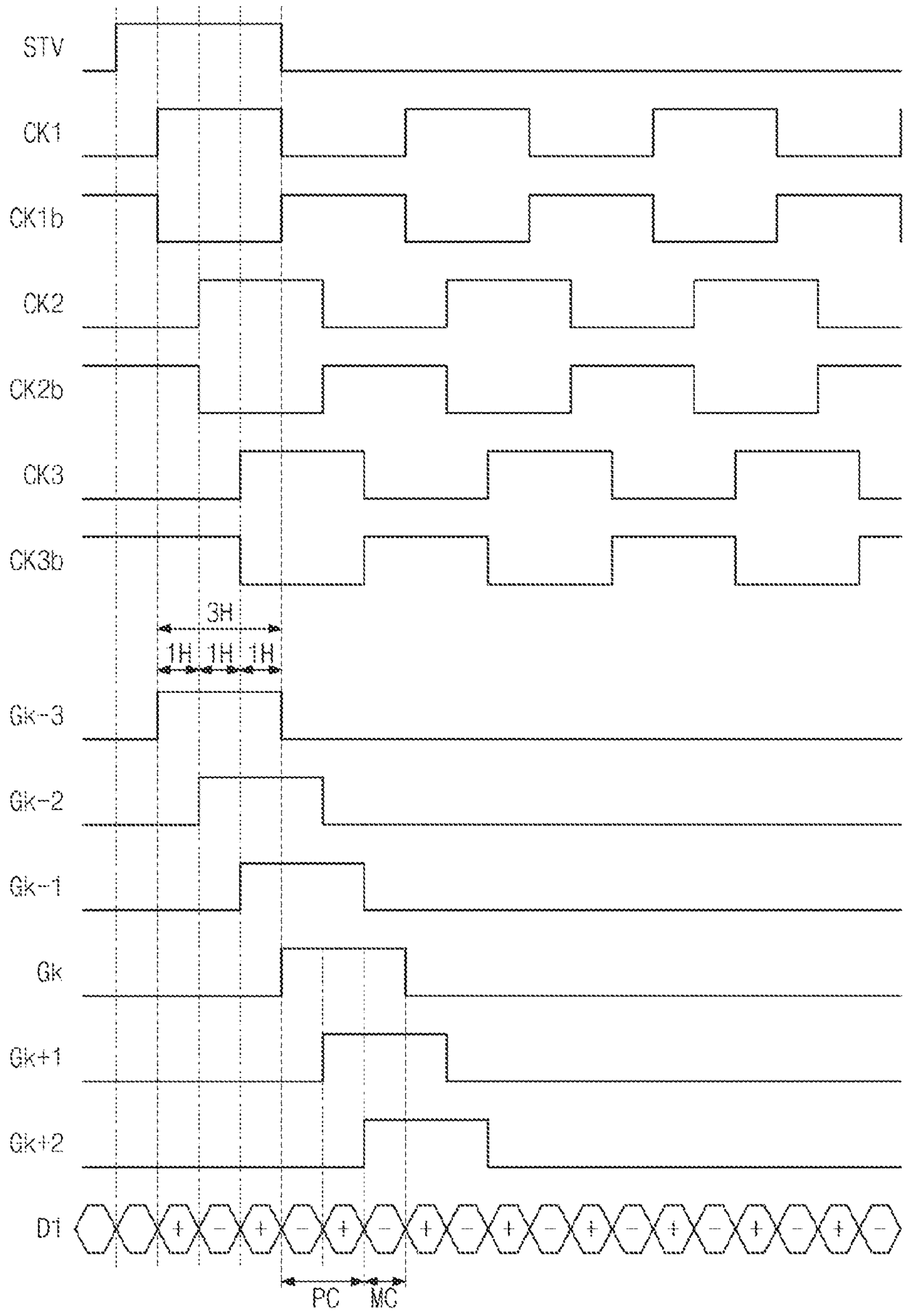
FIG. 4 is a timing diagram illustrating operation of the gate driving circuit illustrated in FIG. 2.

FIG. 4 is a timing diagram illustrating operation of the gate driving circuit illustrated in FIG. 2.

Referring to FIGS. 2 to 4, the clock signal CK1 and the clock signal CK1*b* are complementary signals (inverted signals). The clock signal CK2 and the clock signal CK2*b* are complementary signals. The clock signal CK3 and the clock signal CK3*b* are complementary signals. The stages ST1 to STn have a dependent relationship in which stages that receive the same clock signal and its complementary clock signal send and receive the previous carry signal CRk−3, the next carry signal CRk+3, and the next carry signal CRk+6 between the stages.

Each of the clock signals CK1 to CK3 and CK1*b* to CK3*b* has a pulse width of 3H. Here, H represents a period during which a data signal is provided to the pixels PX of one row illustrated in FIG. 1, i.e., a horizontal period. The clock signal CK1 and the clock signal CK2 are overlapped for 2H, and the clock signal CK2 and the clock signal CK3 are overlapped for 2H.

The transistor T4 of the k-th stage STk is turned on when the carry signal CRk−3 output from the (k−3)-th stage STk−3 has a high level. As the transistor T4 is turned on, the first node N1 is precharged to a predetermined level by the capacitor C1. Thereafter, when the clock signal CKi (CK1*b* in FIG. 4) transitions to a high level, the first output transistor T1 is turned on so that the gate signal Gk is output with a high level. Since the first output transistor T1 is kept turned on by a charge charged in the capacitor C1, the gate signal Gi is maintained in a high level for a period of 3H during which the clock signal CKi has a high level. The second output transistor T14 is operated in a similar manner to that of the first output transistor T1. Therefore, the carry signal CRk is maintained in a high level for a period of 3H, in the same manner as the gate signal Gk.

The data driving circuits 141 to 146 illustrated in FIG. 1 alternately provide, to the data lines DL1 to DLm, a data signal with a positive voltage level (+) higher than that of the common voltage and a data signal with a negative voltage level (−) for each frame and/or each line to prevent degradation of a liquid crystal. For example, the data driving circuits 141 to 146 may alternately provide, to the data lines DL1 to DLm, the data signal with a positive voltage level (+) and the data signal with a negative voltage level (−) for each line in a second direction X2.

As illustrated in FIG. 4, a data signal D1 provided to the data line D1 swings between a positive voltage level (+) and a negative voltage level (−) for each line, i.e., one horizontal period 1H. Therefore, for a period of 3H during which the gate line Gk is driven, a polarity of the data signal D1 is changed in order of a negative voltage level (−), a positive voltage level (+), and a negative voltage level (−). That is, for a precharge interval PC during which the gate signal Gk is activated, the polarity of the data signal D1 is changed in order of a negative voltage level (−) and a positive voltage level (+), and is changed into a negative voltage level (−) at a main charge interval MC. If the pixel PX illustrated in FIG. 1 is precharged and then is immediately main charged to a positive voltage level (+), a charging rate of the pixel PX may degrade.

Figure 5:
FIG. 5 is a graph illustrating the gate signal output from the k-th stage and the carry signals input to the k-th stage illustrated in FIG. 3.

FIG. 5 is a graph illustrating the gate signal output from the k-th stage illustrated in FIG. 3 and the carry signals input to the k-th stage.

Referring to FIGS. 3 and 5, when the first transistor T1 is turned on at a first interval t1, the gate signal Gk is output with a high level. When the next carry signal CRk+1 transitions to a high level at a second interval t2, the transistor T17 of the discharge unit 270 is turned on. As the transistor T17 is turned on, the previous carry signal CRk−1 with a high level is transferred to the control electrode of the transistor T2 of the first pull-down unit 250 through the discharge node N5. Since the transistor T2 of the pull-down unit 250 is turned on by the previous carry signal CRk−1 with a high level, the gate signal Gk starts to be discharged to the first ground voltage VSS1.

Thereafter, as the previous carry signal CRk−1 transitions to a low level at a third interval t3, the transistor T2 of the pull-down unit 250 is turned off, and the gate signal Gk rises to the level of the clock signal CKi. That is, the gate signal Gk arrives at a discharge level Vd before being sufficiently discharged to the first ground voltage VSS1 at the second interval t2, and then returns back to a level Vck of the clock signal CKi.

When the next carry signal CRk+3 transitions to a high level at a fourth interval t4, the transistor T18 of the discharge unit 270 is turned on. Therefore, the previous carry signal CRk−1 and the next carry signal CRn+2 are short-circuited through the discharge node N5.

When the next carry signal CRk+1 transitions to a low level at a fifth interval t5, the transistor T17 of the discharge unit 270 is turned off so that the next carry signal CRn+2 is restored to an original high level.

Figure 6:
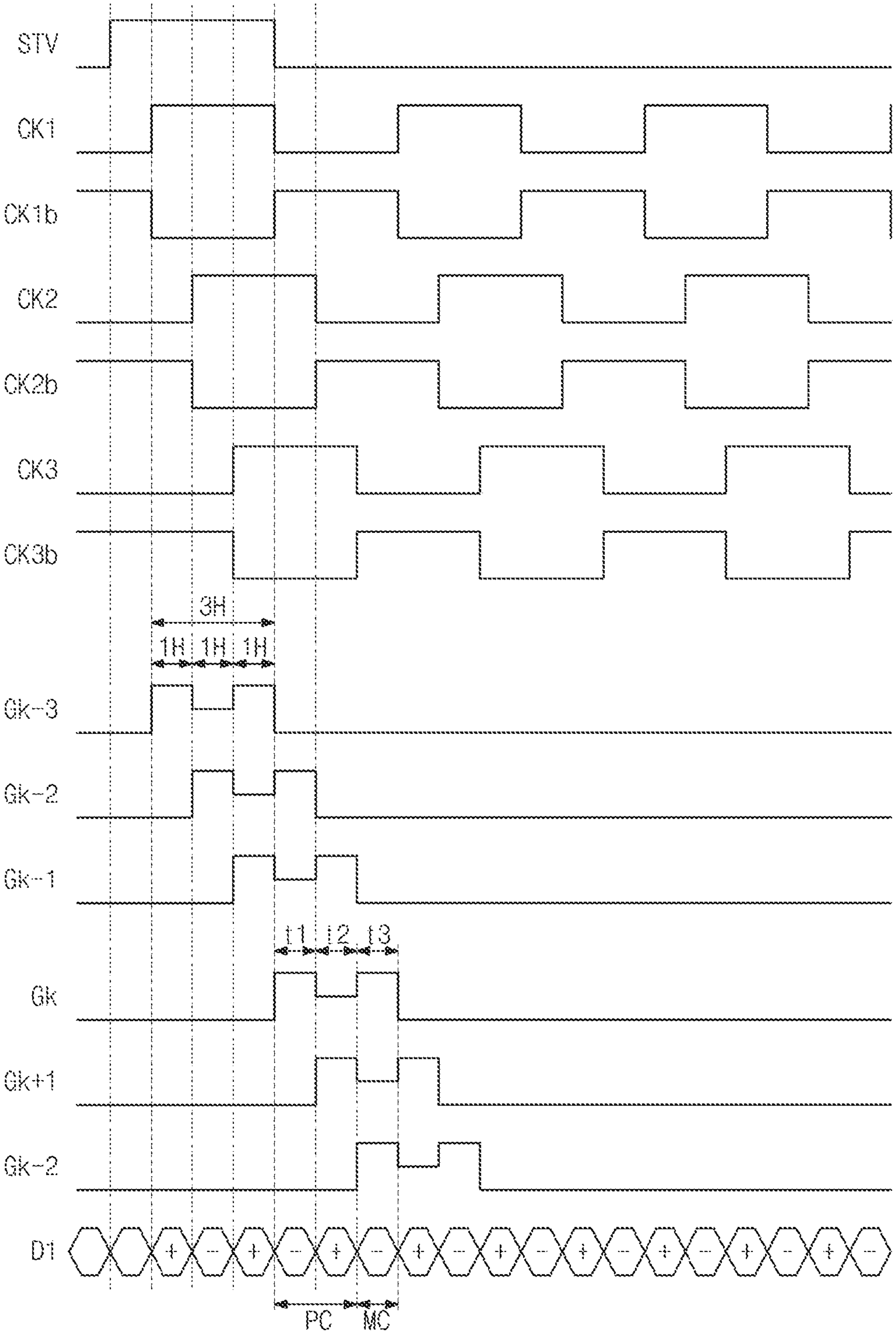
FIG. 6 is a timing diagram illustrating operation of the gate driving circuit illustrated in FIG. 2.

FIG. 6 is a timing diagram illustrating operation of the gate driving circuit illustrated in FIG. 2.

Referring to FIG. 6, the pixel PX is precharged with the data signal D1 with a negative voltage level (−) received through the data line DL1 during a first interval t1 that is the precharge interval PC of the gate signal Gk, and the pixel PX is not precharged at a second interval t2. Furthermore, the pixel PX is charged with the data signal D1 with a negative voltage level (−) received through the data line DL1 during a third interval t3 that is the main charge interval MC. Therefore, in the case where the data driving circuits 141 to 146 illustrated in FIG. 1 alternately provide, to the data lines DL1 to DLm, the data signal D1 with a positive voltage level (+) and the data signal D1 with a negative voltage level (−) for each line in the second direction X2, the pixel PX is precharged only with the data signal having the same polarity as that of the data signal of the main charge interval MC, so that the charging rate of the pixel PX may be improved.

Figure 7:
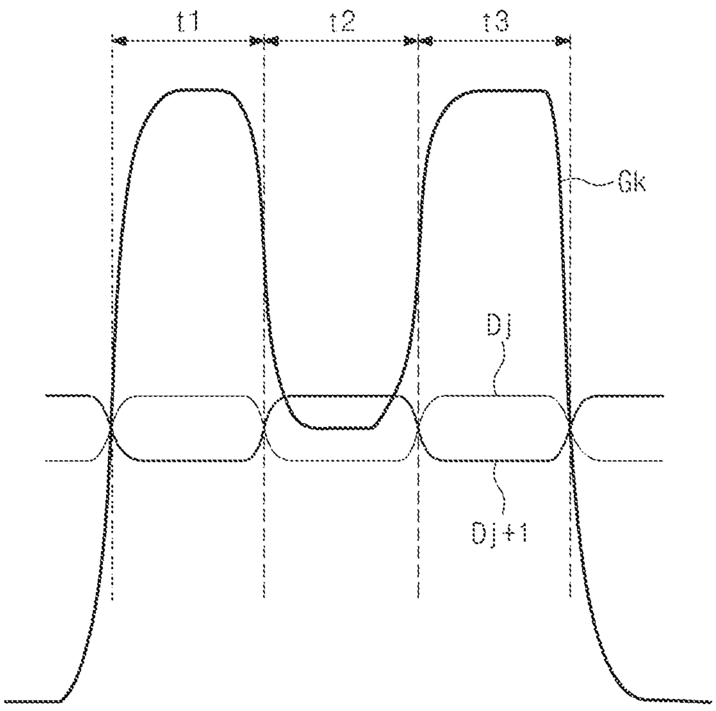
FIG. 7 is a timing diagram illustrating exemplary signals output from the data driving circuits and the gate driving circuits of FIG. 1.

FIG. 7 is a timing diagram illustrating exemplary signals output from the data driving circuits and the gate driving circuits of FIG. 1.

Referring to FIGS. 1 and 7, data signals Dj and Dj+1 output from one of the data driving circuits 141 to 146 swings from a positive voltage level (+) higher than that of the common voltage to a negative voltage level (−) lower than that of the common voltage or from a negative voltage level (−) to a positive voltage level (+). In the example illustrated in FIG. 7, the data signals Dj and Dj+1 have a black level for displaying a black image.

The gate driving circuit 160 outputs the gate signal Gk so that the pixel PX is precharged when a data signal having the same polarity as that of a data signal of a third interval t3 that is the main charge interval is output. That is, the gate signal Gk is discharged at a second interval t2. Here, a voltage level to which the gate signal Gk is discharged at the second interval t2 may be determined according to a size ratio between the transistor T1 and the transistor T2 illustrated in FIG. 3.

Even though the gate signal Gk is not sufficiently discharged to the level of the first or second ground voltage VSS1 or VSS2, the pixel PX is not charged at the second interval t2 since the transistor TR of the pixel PX of FIG. 1 is turned off if a voltage level of the gate signal Gk is lower than the black level of a positive voltage level (+) of the data signals Dj and Dj+1. Furthermore, even though the voltage level of the gate signal Gk is higher than the black level of a negative voltage level (−) of the data signals Dj and Dj+1, the charging amount of the pixel PX at the second interval t2 is not large since the transistor TR of the pixel PX of FIG. 1 is weakly turned on. Therefore, even though the gate signal Gk is not sufficiently discharged to the level of the first or second ground voltage VSS1 or VSS2, the charging amount of the pixel PX may be prevented from being reduced since the pixel PX is precharged when the data signal having the same polarity as that of the data signal of the third interval t3 is output.

Figure 8:
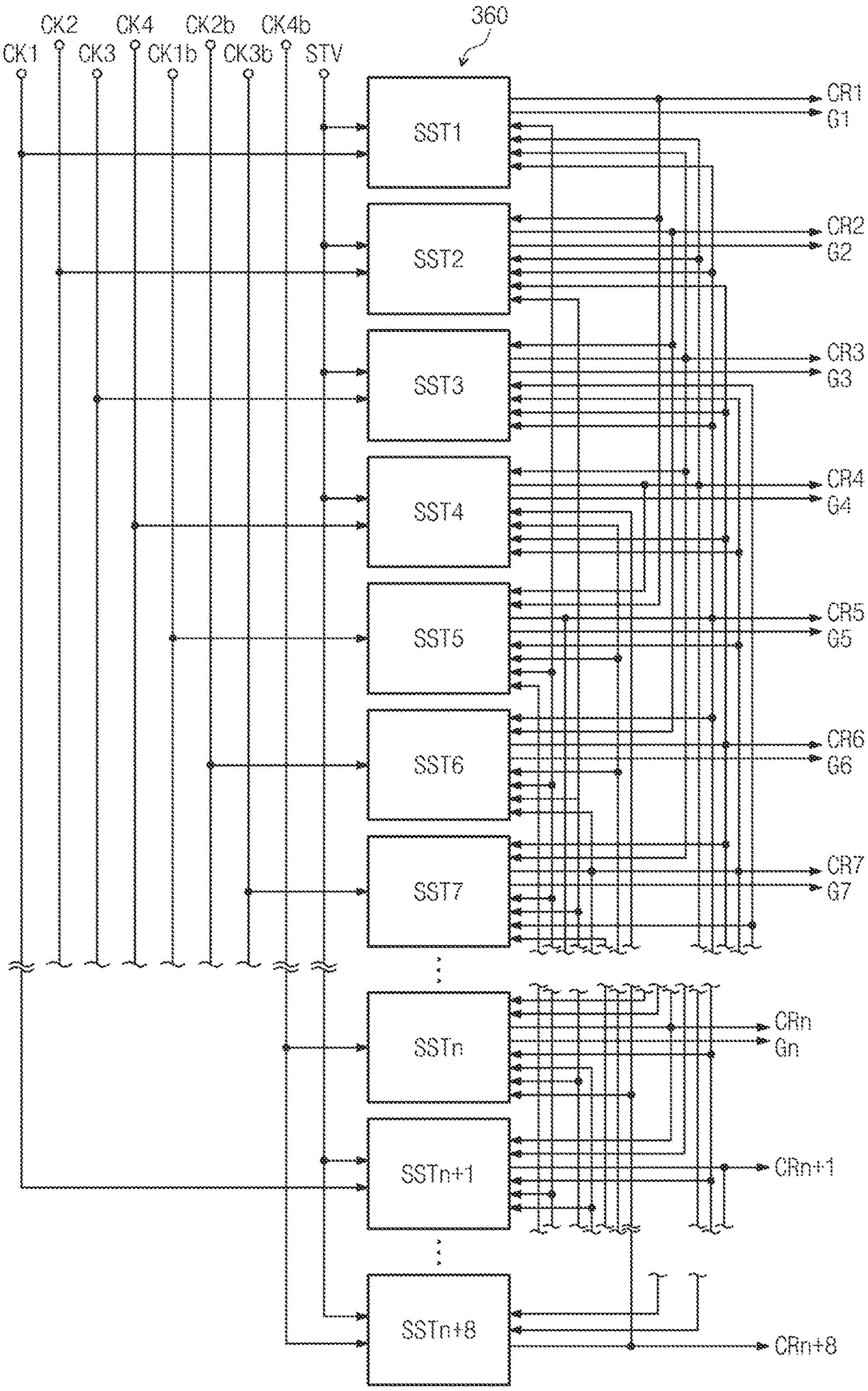
FIG. 8 is a block diagram illustrating another exemplary configuration of the gate driving circuit illustrated in FIG. 1.

FIG. 8 is a block diagram illustrating another exemplary configuration of the gate driving circuit illustrated in FIG. 1.

Referring to FIG. 8, a gate driving circuit 360 includes a plurality of stages SST1 to SSTn and dummy stages SSTn+1 to SSTn+8. The stages SST1 to SSTn respectively correspond to the gate lines GL1 to GLn, and output carry signals CR1 to CRn and gate signals G1 to Gn. The dummy stages SSTn+1 to SSTn+8 output carry signals CRn+1 to CRn+8.

The gate driving circuit 360 receives eight clock signals CK1 to CK4 and CK1_b_ to CK4_b_ from the driving control unit 120 of FIG. 1. The stages SST1, SST9, SST17 and so on are operated in response to the clock signal CK1. The stages SST2, SST10, SST18 and so on are operated in response to the clock signal CK2. The stages SST3, SST11, SST19 and so on are operated in response to the clock signal CK3. The stages SST4, SST12, SST20 and so on are operated in response to the clock signal CK4. The stages SST5, SST13, SST21 and so on are operated in response to the clock signal CK1*b*. The stages SST6, SST14, SST22 and so on are operated in response to the clock signal CK2*b*. The stages SST7, SST15, SST23 and so on are operated in response to the clock signal CK3*b*. The stages SST8, SST16, SST24 and so on are operated in response to the clock signal CK4*b*. The dummy stages SSTn+1 to SSTn+8 are operated in response to the clock signals CK1 to CK4 and CK1*b* to CK4*b* respectively.

The stages SST1 receive a vertical synchronization start signal STV, a next carry signal CRk+2, a next carry signal CRk+3, a next carry signal CRk+4, and a next carry signal CRk+8, and outputs a carry signal CRk and a gate signal Gk. The stages SSTk (where 2≤k≤4) receive a vertical synchronization start signal STVSTV, a previous carry signal CRk−1, a next carry signal CRk+2, a next carry signal CRk+3, a next carry signal CRk+4, and a next carry signal CRk+8, and outputs a carry signal CRk and a gate signal Gk.

The stages SSTk (where 4<k≤n) receive a previous carry signal CRk−4, a previous carry signal CRk−1, a next carry signal CRk+2, a next carry signal CRk+3, a next carry signal CRk+4, and a next carry signal CRk+8, and outputs the carry signal CRk and the gate signal Gk.

The dummy stage SSTn+1 receives a previous carry signal CRn−3, a previous carry signal CRn, a next carry signal CRn+3, a next carry signal CRn+4, a next carry signal CRn+5, and the vertical synchronization start signal STV, and outputs a carry signal CRn+1. The dummy stage SSTn+2 receives a previous carry signal CRn−2, a previous carry signal CRn+1, a next carry signal CRn+4, a next carry signal CRn+5, a next carry signal CRn+6, and the vertical synchronization start signal STV, and outputs a carry signal CRn+2. The dummy stage SSTn+3 receives a previous carry signal CRn−1, a previous carry signal CRn+2, a next carry signal CRn+5, a next carry signal CRn+6, a next carry signal CRn+7, and the vertical synchronization start signal STV, and outputs a carry signal CRn+3. The dummy stage SSTn+4 receives a previous carry signal CRn, a previous carry signal CRn+3, a next carry signal CRn+6, a next carry signal CRn+7, a next carry signal CRn+8, and the vertical synchronization start signal STV, and outputs a carry signal CRn+4. The dummy stage SSTn+5 receives a previous carry signal CRn+1, a previous carry signal CRn+4, a next carry signal CRn+7, a next carry signal CRn+8, and the vertical synchronization start signal STV, and outputs a carry signal CRn+5. The dummy stage SSTn+6 receives a previous carry signal CRn+2, a previous carry signal CRn+5, a next carry signal CRn+8, and the vertical synchronization start signal STV, and outputs a carry signal CRn+6. The dummy stage SSTn+7 receives a previous carry signal CRn+3, a previous carry signal CRn+6, and the vertical synchronization start signal STV, and outputs a carry signal CRn+7. The dummy stage SSTn+8 receives a previous carry signal CRn+4, a previous carry signal CRn+7, and the vertical synchronization start signal STV, and outputs a carry signal CRn+8.

Although not illustrated in FIG. 6, each of the stages SST1 to SSTn and the dummy stages SSTn+1 to SSTn+8 is connected to the first ground voltage VSS1 and the second ground voltage VSS2. In the present embodiment, the first ground voltage VSS1 and the second ground voltage VSS2 have different voltage levels. In another embodiment, the first ground voltage VSS1 and the second ground voltage VSS2 may have the same voltage level.

Figure 9:
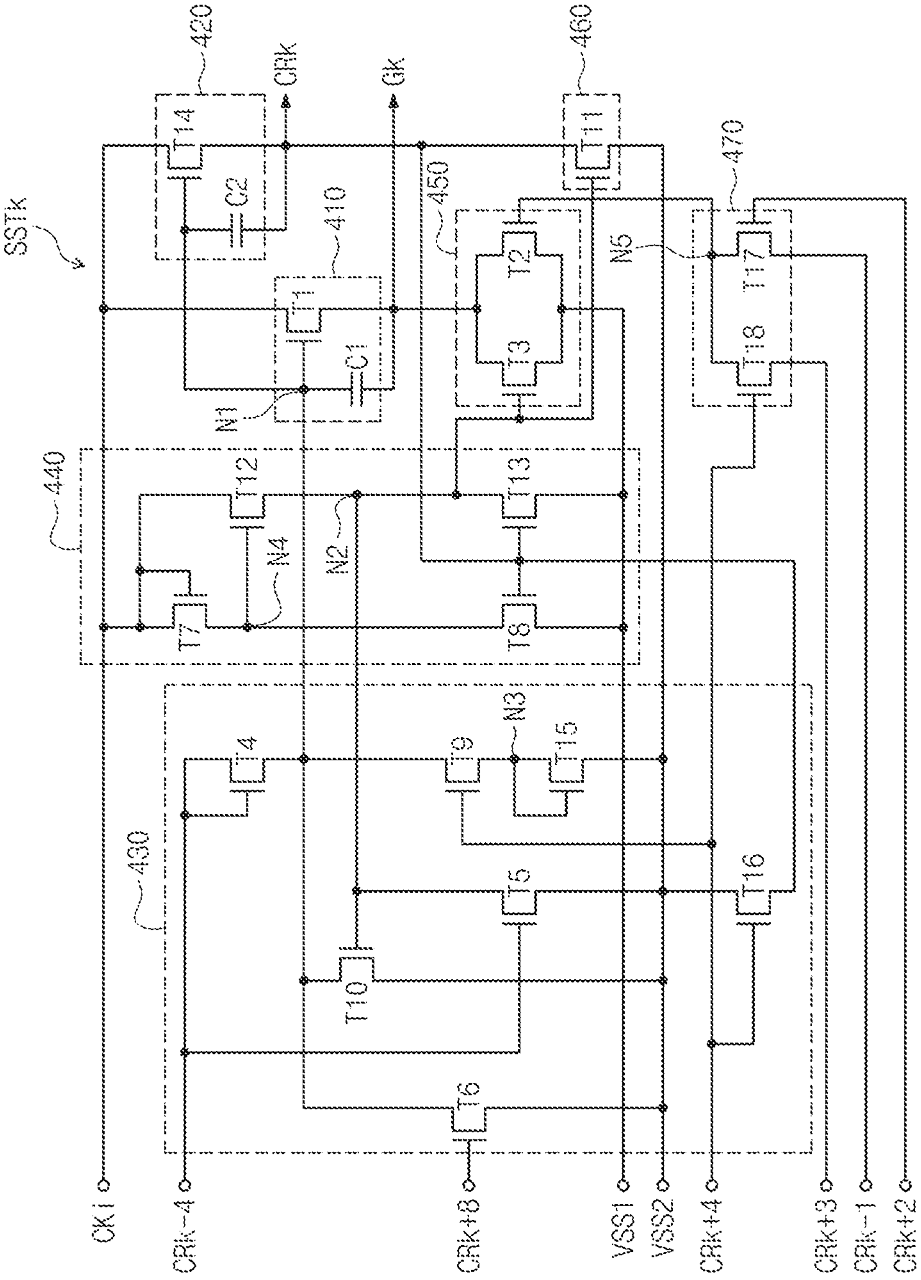
FIG. 9 is diagram exemplarily illustrating one of the stages illustrated in FIG. 6.

FIG. 9 is diagram exemplarily illustrating one of the stages illustrated in FIG. 6.

Referring to FIG. 9, the stage SSTk (where 4<k≤n) includes a first output unit 410, a second output unit 420, a control unit 430, an inverter unit 440, a first pull-down unit 450, a second pull-down unit 460, and a discharge unit 470. Since a configuration and operation of the state SSTk of FIG. 7 are similar to those of the stage STk of FIG. 3, overlapping descriptions are not provided.

Figure 10:
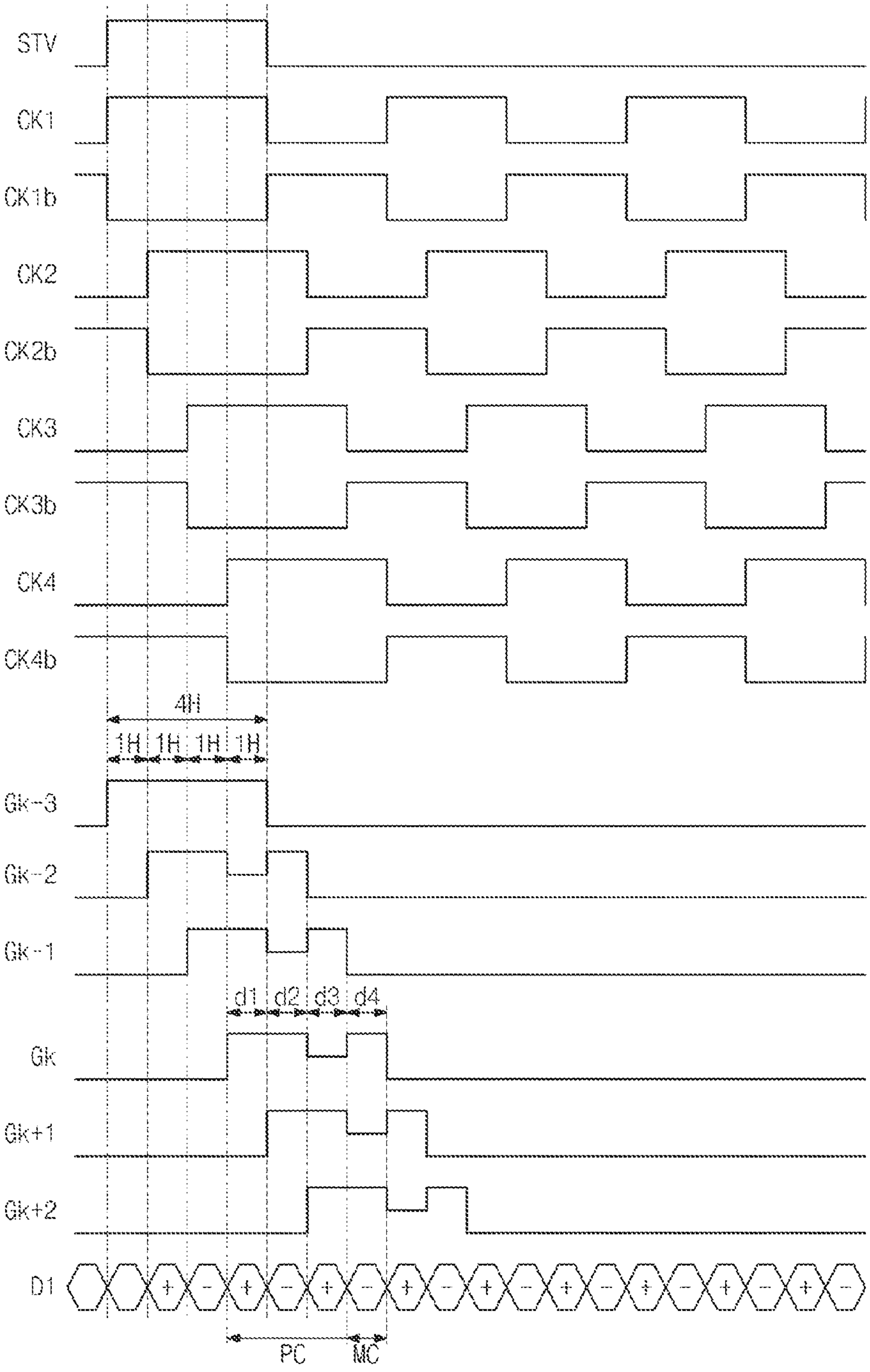
FIG. 10 is a timing diagram illustrating operation of the gate driving circuit illustrated in FIG. 9.

FIG. 10 is a timing diagram illustrating operation of the gate driving circuit illustrated in FIG. 9.

Referring to FIGS. 8 and 10, in the precharge interval PC of the gate signal Gk, the pixel PX is sequentially precharged with a positive data signal (+) and a negative data signal (−) during a first interval d1 and a second interval d2, but is not precharged at a third interval d3. Furthermore, the pixel PX is charged with a negative data signal (−) received through the data line during a fourth interval d4 that is the main charge interval MC. Therefore, in the case in which the data driving circuits 141 to 146 illustrated in FIG. 1 alternately provide, to the data lines DL1 to DLm, the positive data signal (+) and the negative data signal (−) for each line in the second direction X2, the pixel PX is not precharged at the third interval t3 of the precharged interval PC immediately before the main charge interval MC, so that the charging rate of the pixel PX may be improved.

The display device configured as described above may precharge pixels connected to a k-th gate line while a (k−2)-th gate line is driven. Therefore, the charging rate of a pixel may be increased.

The above-disclosed subject matter is to be considered illustrative and not restrictive, and the appended claims are intended to cover all such modifications, enhancements, and other embodiments that fall within the true spirit and scope of the present disclosure. Thus, to the maximum extent allowed by law, the scope of the following claims is to be determined by their broadest permissible interpretation and shall not be restricted or limited by the foregoing detailed description.

What is claimed is:

1. A gate driving circuit comprising a plurality of stages for providing gate signals to gate lines of a display panel, a k-th stage of the stages comprising:

a first output transistor comprising a control electrode connected to a first node, an input electrode configured to receive a clock signal, and an output electrode configured to output a k-th gate signal;

a second output transistor comprising a control electrode connected to the first node, an input electrode configured to receive the clock signal, and an output electrode configured to output a k-th carry signal;

a pull-down unit connected to a discharge node and configured to pull down the output electrode of the first output transistor in response to a signal of the discharge node; and a discharge unit configured to output a (k−1)-th carry signal output from a (k−1)-th stage to the discharge node in response to a (k+1)-th carry signal output from a (k+1)-th stage, wherein the discharge unit is further configured to output a (k+2)-th carry signal output from a (k+2)-th stage to the discharge node in response to a (k+3)-th carry signal output from a (k+3)-th stage.

2. The gate driving circuit of claim 1, wherein the discharge unit comprises:

a first discharge transistor connected between the discharge node and the (k−1)-th carry signal, the first discharge transistor comprising a control electrode connected to the (k+1)-th carry signal; and a second discharge transistor connected between the discharge node and the (k+2)-th carry signal, the second discharge transistor comprising a control electrode connected to the (k+3)-th carry signal.

3. The gate driving circuit of claim 2, further comprising: a control unit configured to control potentials of the first node and a second node in response to a (k−3)-th carry signal output from a (k−3)-th stage, a (k+6)-th carry signal output from a (k+6)-th stage, and the (k+3)-th carry signal output from the (k+3)-th stage.

4. The gate driving circuit of claim 3, wherein the pull-down unit comprises:

a first pull-down transistor connected between the output electrode of the first output transistor and a first ground voltage, the first pull-down transistor comprising a control electrode connected to the discharge node; and a second pull-down transistor connected between the output electrode of the first output transistor and the first ground voltage, the second pull-down transistor comprising a control electrode connected to the second node.

5. The gate driving circuit of claim 1, further comprising: a first capacitor connected between the output electrode of the first output transistor and the control electrode of the first output transistor; and a second capacitor connected between the output electrode of the second output transistor and the control electrode of the second output transistor.

6. The gate driving circuit of claim 5, wherein a capacitance of the second capacitor is greater than that of the first capacitor.

7. A gate driving circuit comprising stages for providing gate signals to gate lines of a display panel, a k-th stage of the stages comprising:

a first output transistor comprising a control electrode connected to a first node, an input electrode configured to receive a clock signal, and an output electrode configured to output a k-th gate signal;

a second output transistor comprising a control electrode connected to the first node, an input electrode configured to receive the clock signal, and an output electrode configured to output a k-th carry signal;

a pull-down unit connected to a discharge node and configured to pull down the output electrode of the first output transistor in response to a signal of the discharge node; and a discharge unit configured to output a (k−1)-th carry signal output from a (k−1)-th stage to the discharge node in response to a (k+2)-th carry signal output from a (k+2)-th stage, wherein the discharge unit is further configured to output a (k+3)-th carry signal output from a (k+3)-th stage to the discharge node in response to a (k+4)-th carry signal output from a (k+4)-th stage.

8. The gate driving circuit of claim 7, wherein the discharge unit comprises:

a first discharge transistor connected between the discharge node and the (k−1)-th carry signal, the first discharge transistor comprising a control electrode connected to the (k+2)-th carry signal; and a second discharge transistor connected between the discharge node and the (k+3)-th carry signal, the second discharge transistor comprising a control electrode connected to the (k+4)-th carry signal.

9. The gate driving circuit of claim 8, further comprising: a control unit configured to control potentials of the first node and a second node in response to a (k−4)-th carry signal output from a (k−4)-th stage, a (k+8)-th carry signal output from a (k+8)-th stage, and the (k+4)-th carry signal output from the (k+4)-th stage.

10. The gate driving circuit of claim 9, wherein the pull-down unit comprises:

a first pull-down transistor connected between the output electrode of the first output transistor and a first ground voltage, the first pull-down transistor comprising a control electrode connected to the discharge node; and a second pull-down transistor connected between the output electrode of the first output transistor and the first ground voltage, the second pull-down transistor comprising a control electrode connected to the second node.

11. A display device comprising:

a display panel comprising a plurality of pixels respectively connected to a plurality of gate lines and a plurality of data lines;

a data driving circuit configured to periodically invert a polarity of a data signal to drive the data lines; a gate driving circuit configured to output a plurality of gate signals for driving the gate lines in response to a clock signal; and a driving control unit configured to provide the data signal to the data driving circuit and provide the clock signal to the gate driving circuit, wherein the gate driving circuit comprises a plurality of stages, wherein a k-th stage of the stages comprises:

a first output transistor comprising a control electrode connected to a first node, an input electrode configured to receive the clock signal, and an output electrode configured to output a k-th gate signal;

a second output transistor comprising a control electrode connected to the first node, an input electrode configured to receive the clock signal, and an output electrode configured to output a k-th carry signal;

a pull-down unit connected to a discharge node and configured to pull down the output electrode of the first output transistor in response to a signal of the discharge node; and a discharge unit configured to output a (k−1)-th carry signal output from a (k−1)-th stage to the discharge node in response to a (k+1)-th carry signal output from a (k+1)-th stage, wherein the discharge unit is further configured to output a (k+2)-th carry signal output from a (k+2)-th stage to the discharge node in response to a (k+3)-th carry signal output from a (k+3)-th stage.

12. The display device of claim 11, wherein the discharge unit comprises: a first discharge transistor connected between the discharge node and the (k−1)-th carry signal, the first discharge transistor comprising a control electrode connected to the (k+1)-th carry signal; and a second discharge transistor connected between the discharge node and the (k+2)-th carry signal, the second discharge transistor comprising a control electrode connected to the (k+3)-th carry signal.

13. The display device of claim 12, further comprising: a control unit configured to control potentials of the first node and a second node in response to a (k−3)-th carry signal output from a (k−3)-th stage, a (k+6)-th carry signal output from a (k+6)-th stage, and the (k+3)-th carry signal output from the (k+3)-th stage.

14. The display device of claim 13, wherein the pull-down unit comprises:

a first pull-down transistor connected between the output electrode of the first output transistor and a first ground voltage, the first pull-down transistor comprising a control electrode connected to the discharge node; and a second pull-down transistor connected between the output electrode of the first output transistor and the first ground voltage, the second pull-down transistor comprising a control electrode connected to the second node.

15. The display device of claim 11, further comprising: a first capacitor connected between the output electrode of the first output transistor and the control electrode of the first output transistor; and a second capacitor connected between the output electrode of the second output transistor and the control electrode of the second output transistor.

16. The display device of claim 15, wherein a capacitance of the second capacitor is greater than that of the first capacitor.

* * * * *